(12) United States Patent
McKenney et al.

(10) Patent No.: US 10,096,915 B2
(45) Date of Patent: Oct. 9, 2018

(54) SOLDERED INTERCONNECT FOR A PRINTED CIRCUIT BOARD HAVING AN ANGULAR RADIAL FEATURE

(71) Applicant: MERCURY SYSTEMS, INC., Andover, MA (US)

(72) Inventors: Darryl J. McKenney, Londonderry, NH (US); Absu Methratta, Waltham, MA (US); Erica Ouellette, Boxboro, MA (US)

(73) Assignee: MERCURY SYSTEMS, INC., Andover, MA (US)

( * ) Notice: Subject to any disclaimer, the term of this patent is extended or adjusted under 35 U.S.C. 154(b) by 0 days.

(21) Appl. No.: 15/423,269

(22) Filed: Feb. 2, 2017

(65) Prior Publication Data

US 2017/0149154 A1     May 25, 2017

Related U.S. Application Data

(62) Division of application No. 14/952,242, filed on Nov. 25, 2015.

(51) Int. Cl.
*H01R 12/58* (2011.01)
*H05K 1/02* (2006.01)
(Continued)

(52) U.S. Cl.
CPC ............ *H01R 12/58* (2013.01); *H01R 9/091* (2013.01); *H01R 12/716* (2013.01);
(Continued)

(58) Field of Classification Search
CPC .............................. H01R 12/716; H01R 12/58
See application file for complete search history.

(56) References Cited

U.S. PATENT DOCUMENTS 3,246,386 A    4/1966 Ende
3,325,752 A    6/1967 Barker
(Continued)

FOREIGN PATENT DOCUMENTS

WO    2009/057614 A1    5/2009

OTHER PUBLICATIONS

International Search Report, PCT/US2016/063260, dated Mar. 20, 2017, 14 pages.
(Continued)

*Primary Examiner* — William H Mayo, III
*Assistant Examiner* — Hiram E Gonzalez
(74) *Attorney, Agent, or Firm* — Nelson Mullins Riley & Scarborough LLP

(57) ABSTRACT

According to exemplary embodiments, a tapered surface interconnect is formed on a printed circuit board (PCB). A compliant pin of an electrical connector may be coupled to the tapered surface interconnect and soldered thereto. The surface interconnect may be formed by drilling through one or more layers of the PCB. The depth of the surface interconnect may be shorter than a height or a thickness of the PCB. The surface interconnect may have a tapered side wall to allow for a better fit with a tapered compliant pin. The inclination of the side wall of the surface interconnect may be linear or concave. The intersection between the tapered sidewall and the bottom of the surface interconnect may be rounded to minimize pin insertion issues and may allow for easier solder flux evacuation. The compliant pin may be soldered into place upon being coupled to the tapered surface interconnect.

4 Claims, 8 Drawing Sheets

(51) Int. Cl.
    *H01R 12/71* (2011.01)
    *H01R 13/652* (2006.01)
    *H05K 1/11* (2006.01)
    *H05K 1/18* (2006.01)
    *H05K 3/34* (2006.01)
    *H01R 12/00* (2006.01)
    *H05K 3/30* (2006.01)
    *H05K 3/42* (2006.01)

(52) U.S. Cl.
    CPC ......... *H01R 13/652* (2013.01); *H05K 1/0213* (2013.01); *H05K 1/0237* (2013.01); *H05K 1/0298* (2013.01); *H05K 1/11* (2013.01); *H05K 1/111* (2013.01); *H05K 1/181* (2013.01); *H05K 3/308* (2013.01); *H05K 3/34* (2013.01); *H05K 1/184* (2013.01); *H05K 3/421* (2013.01); *H05K 2201/09827* (2013.01); *H05K 2201/1078* (2013.01); *H05K 2201/10098* (2013.01); *H05K 2201/10189* (2013.01); *H05K 2201/10295* (2013.01); *H05K 2201/10803* (2013.01); *H05K 2201/10878* (2013.01); *H05K 2201/10901* (2013.01)

(56) References Cited

U.S. PATENT DOCUMENTS

| | | |
|---|---|---|
| 4,787,853 A | 11/1988 | Igarashi |
| 5,516,303 A | 5/1996 | Yohn et al. |
| 6,146,156 A | 11/2000 | Yang |
| 7,155,821 B1 | 1/2007 | Downes et al. |
| 7,880,291 B2 | 2/2011 | Park et al. |
| 8,113,884 B2 | 2/2012 | Matsuzaki et al. |
| 8,153,900 B2 | 4/2012 | Takeuchi et al. |
| 8,379,402 B2* | 2/2013 | Oshima ............ H01L 23/49811 174/263 |
| 8,536,696 B2 | 9/2013 | Hirose et al. |
| 8,796,559 B2 | 8/2014 | Baek et al. |
| 8,808,026 B2 | 8/2014 | Yamaguchi et al. |
| 2001/0015491 A1 | 8/2001 | Shiraishi |
| 2002/0195271 A1 | 12/2002 | Gallus |
| 2004/0182604 A1* | 9/2004 | Alcoe ............... H01L 23/49811 174/267 |
| 2011/0061910 A1 | 3/2011 | Sung et al. |
| 2011/0067899 A1* | 3/2011 | Choi ................. H01L 23/49811 174/126.1 |

OTHER PUBLICATIONS

International Preliminary Report on Patentability, PCT/US2016/063260, dated Feb. 5, 2018, 16 pages.

\* cited by examiner

SOLDERED INTERCONNECT FOR A PRINTED CIRCUIT BOARD HAVING AN ANGULAR RADIAL FEATURE

CROSS-REFERENCE TO RELATED APPLICATIONS

The present application is a divisional application of U.S. patent application Ser. No. 14/952,242, filed on Nov. 25, 2015, the contents of which are herein incorporated by reference.

FIELD OF THE INVENTION

The present invention generally relates to a plated hole on a printed circuit board wafer and an electrical connector coupled to thereto and, more specifically, a plated hole with a tapered surface on a printed circuit board wafer and an electrical connector having a matching tapered end coupled to the plated hole of the printed circuit board wafer and soldered thereto.

BACKGROUND

Conventionally, electronic components may be mounted on a printed circuit board (PCB) using a through-hole technique or surface-mount technique. In the through hole technique, a plurality of holes are drilled on one surface of the PCB. The holes are designed to pass through all layers of the PCB to the other surface of the PCB. The electronic components contain pins for coupling the electronic components to the PCB. In the through hole technique, the pins fit into a plurality of holes, trimmed on the opposite side of the PCB, and are soldered in place. Accordingly, using the through hole technique, components are typically placed on one side of the PCB.

Using the surface-mount technique, the electronic devices are directly mounted on a surface of the PCB. The devices are soldered directly onto the PCB. The surface-mount technique eliminates the need to drill holes on the PCB and allows for much smaller components to be coupled to the PCB. Using the surface-mount technique, components can be mounted on both sides of the PCB.

Both mounting techniques suffer from problems caused by the misalignment of the components or connectors on the PCB. The misalignment may cause undesirable crosstalk among the components on the PCB. In addition, current mounting techniques are not desirable for rugged applications due to the common problem of fretting. Fretting refers to the wear that occurs between two surfaces that are in contact with each other under a load. Fretting is particularly prevalent in the presence of vibration, which is an important concern for high-vibration environments, such as a circuit board mounted in vehicles used in rough terrains, airplanes or missiles.

SUMMARY

According to various embodiments, a printed circuit board is provided. The PCB comprises a multi-layer body sandwiched between a top surface and a bottom surface. At least one tapered surface interconnect may be mechanically drilled on the top layer. The at least one tapered surface interconnect has one or more tapered side walls. The at least one tapered surface interconnect is sized and configured to accept a compliant pin and solder. The at least one tapered surface interconnect may be include a linear inclination taper section and/or a radial inclination taper section, with the radial inclination taper section being concave. The at least one tapered surface interconnect may have a flared entrance aperture.

According to other embodiments, an electrical connector is provided. The electrical connector comprises a connector body and a connection pin provided at a first end of the connector body. The connection pin includes a tapered end and a groove formed above the tapered end of the connection pin. The connection pin may further include an anchoring feature at an extremity of the tapered end.

According to various embodiments, an electrical interconnect assembly is provided. The electrical interconnect assembly includes a printed circuit board and an electrical connector. The printed circuit board includes a multi-layer body sandwiched between a top surface and a bottom surface. At least one tapered surface interconnect is formed on the top layer of the printed circuit board. The electrical connector is coupled to the at least one tapered surface interconnect of the printed circuit board. The electrical connector includes a connector body and a connection pin provided at a first end of the connector body. The connection pin includes a tapered end and a groove formed above the tapered end of the connection pin. The connection pin is soldered to the top surface of the printed circuit board at the groove.

BRIEF DESCRIPTION OF THE DRAWINGS

The accompanying drawings, which are incorporated in and constitute a part of this specification, illustrate one or more embodiments described herein and, together with the description, explain these embodiments. In the drawings.

DETAILED DESCRIPTION

Embodiments of the present invention may provide a tapered surface interconnect formed on a printed circuit board (PCB). A compliant pin of an electrical connector may be coupled to the tapered surface interconnect and soldered thereto. The surface interconnect may be formed by drilling through one or more layers of the PCB. According to various embodiments, the surface interconnect is not a through hole. That is, a depth of the surface interconnect is shorter than a height or a thickness of the PCB. The surface interconnect may have a tapered side wall to allow for a better fit with a tapered compliant pin. The tapered surface interconnect may be include a linear taper section and/or a radial, i.e. concave, taper section. The bottom of the tapered surface interconnect may be rounded, flat, and/or pointed. The compliant pin may be soldered in place upon being coupled to the tapered surface interconnect. The tapered surface interconnect and tapered compliant pin assembly may provide up to 20 decibels (dB) reduction in crosstalk due to the tuned structure and rugged solder assembly.

Figure 1:
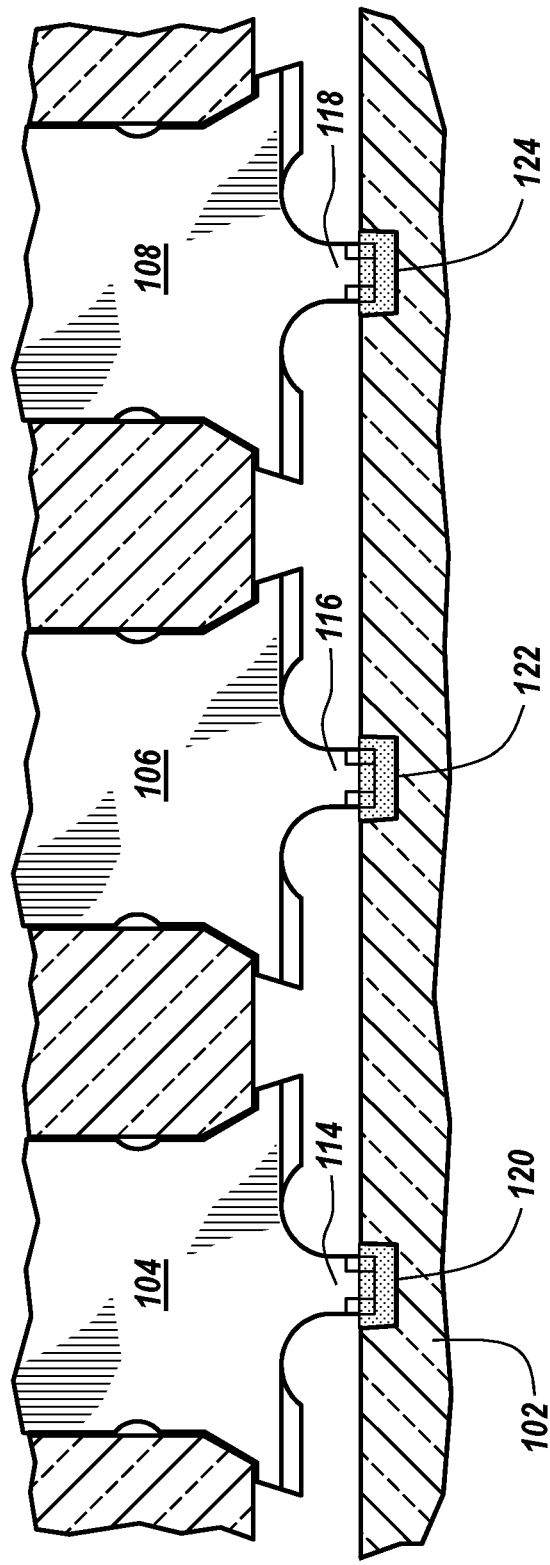
FIG. 1 illustrates a plurality of exemplary electrical connectors with compliant pins coupled to surface interconnects on a printed circuit board (PCB)

FIG. 1 illustrates exemplary electrical interconnects 104, 106, 108 coupled to an exemplary printed circuit board (PCB) 102. The PCB 102 includes a plurality of surface interconnects 120, 122, 124. The surface interconnects 120, 122, 124 are drilled onto PCB 102. Each surface interconnect 120, 122, 124 is sized and configured to accept therein a compliant pin 114, 116, 118 of the electrical interconnects 104, 106, 108, respectively. The surface interconnects 120, 122, 124 may have tapered side walls to create a better fit between the surface interconnect and the compliant pin. The improved fit may have significant impact on electrical cross talk reduction.

According to various embodiments, the compliant pins 114, 116, 118 of the electrical interconnects 104, 106, 108 may be soldered in place after being coupled to the surface interconnects 120, 122, 124 of the PCB 102. The surface interconnects 120, 122, 124 may be sized and configured to accept a portion of the solder therein.

The surface interconnects may be drilled through one or more layers of the PCB. The surface interconnects may not be through holes that extend through an entire thickness, i.e. the height, of the PCB.

Figure 2A:
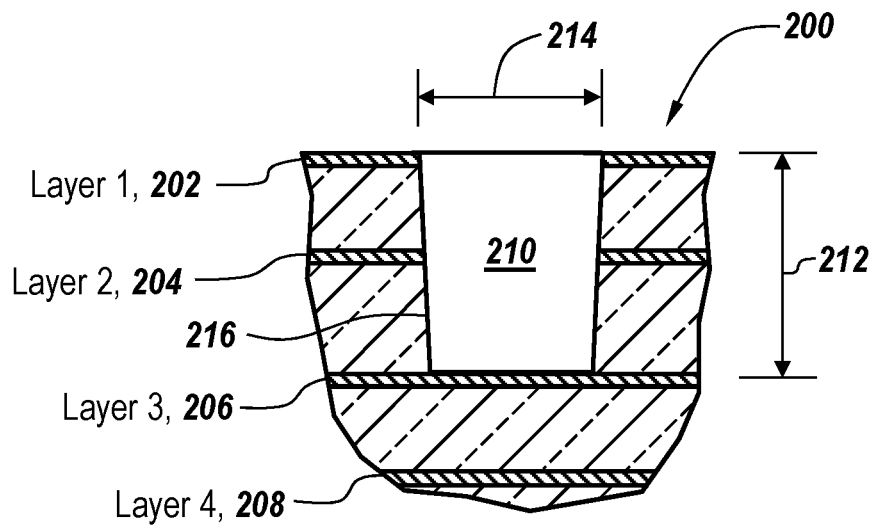
FIG. 2A illustrates an exemplary surface interconnect drilled through a plurality of layers of the PCB.
Figure 2B:
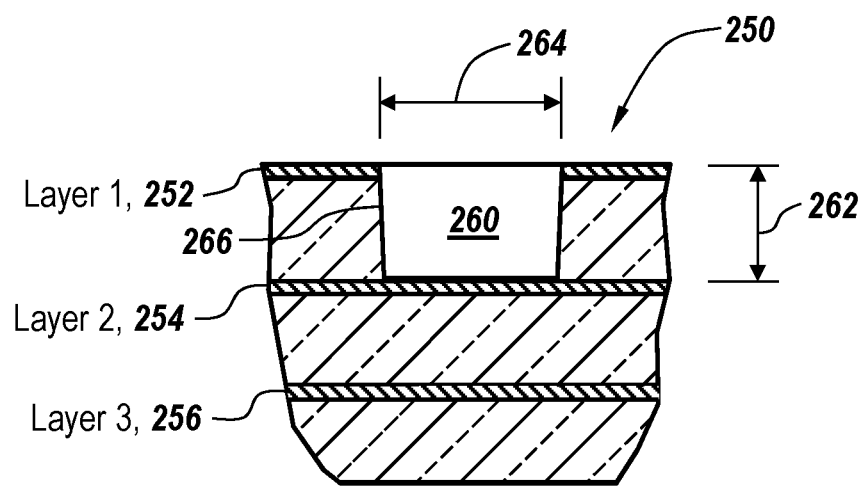
FIG. 2B illustrates an exemplary surface interconnect drilled through one top layer of the PCB.

FIGS. 2A-2B illustrate exemplary surface interconnects formed on a PCB according to various embodiments.

FIG. 2A illustrates an exemplary multi-layer PCB 200. For example, PCB 200 may have at least four layers 202, 204, 206, 208. According to an exemplary embodiment, the surface interconnect 210 may be drilled up to the third layer 206 of PCB 200. The surface interconnect 210 may have a depth 212 substantially equivalent to a height of the first two layers 202, 204 of the PCB 200. According to various embodiments, the surface interconnect 210 may have a depth 212 of up to 0.05 inches. The surface interconnect 210 may have a tapered side wall 216. For example, the side wall 216 may have at least one of no inclination, a linear inclination up to 15°, and a concave inclination. The side wall 216 may a flared entrance aperture. A width of the surface opening 214 of the surface interconnect 210 provided at the top layer 202 of the PCB 200 may be up to 0.05 inches.

FIG. 2B illustrates another exemplary multi-layer PCB 250. As provided above, in connection with various embodiments, the surface interconnect may be drilled through one layer of a multilayer PCB. For example, the PCB may have at least three layers 252, 254, 256. According to an exemplary embodiment, the surface interconnect 260 may be drilled up to the second layer 256 of the PCB 250. The surface interconnect 260 may have a depth 262 substantially equivalent to a height of the first layer 252 of PCB 250. According to various embodiments, the surface interconnect 260 may have a depth 262 of up to 0.05 inches. The surface interconnect 260 may have tapered side wall 266. For example, the side wall 266 may have at least one of no inclination, a linear inclination up to 15°, and a concave inclination. The side wall 216 may a flared entrance aperture. A width of the surface opening 264 of the surface interconnect 260 provided at the top layer 252 of PCB 250 may be as small as 0.004 inches and up to 0.035 inches.

Figure 3:
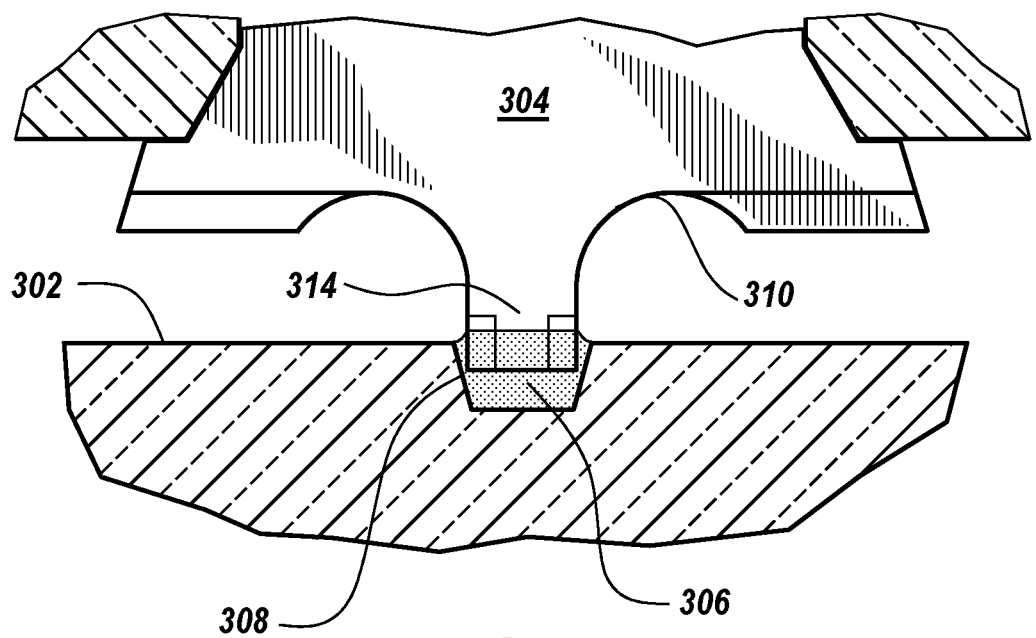
FIG. 3 illustrates an exemplary electrical connector with a compliant pin coupled to a tapered surface interconnect on a PCB and soldered thereto.

FIG. 3 illustrates an exemplary electrical connector 304 coupled and soldered to an exemplary PCB 302. According to various embodiments, the compliant pin coupled to the tapered surface interconnect may be soldered thereto. The electrical connector 304 may include a compliant pin 314 formed at a distal end 310 thereof. The electrical connector 304 may be coupled to the PCB 302 by inserting the compliant pin 314 inside a surface interconnect 306 drilled on the surface of the PCB 302. The surface interconnect 306 may have tapered side wall 308 to create a better fit between the surface interconnect 306 and the compliant pin 314.

FIGS. 4A-4F illustrate some exemplary configurations for the compliant pin and surface interconnect geometries. The compliant pin of the electrical connector and the surface interconnect of the PCB may have various configurations. One of ordinary skill in the art would appreciate that the shown configurations are illustrative purposes only and should not be construed as limiting.

Figure 4A:
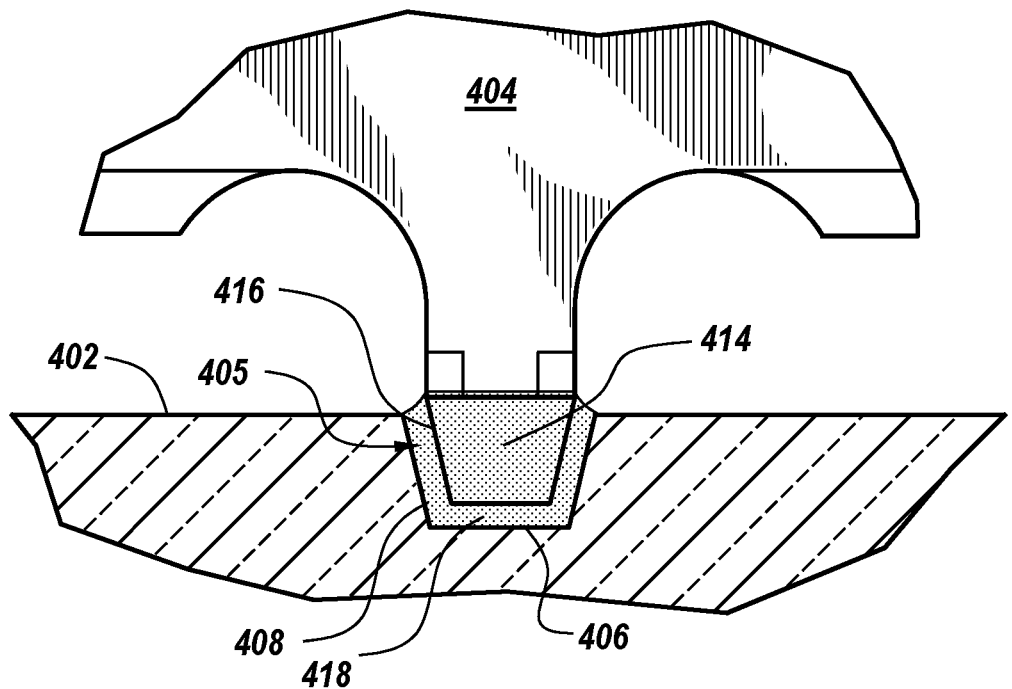
FIG. 4A illustrates an exemplary electrical connector with a short tapered compliant pin coupled to a linearly tapered surface interconnect on a PCB and soldered thereto according to an illustrative embodiment of the present invention.

FIG. 4A illustrates an electrical connector 404 with a compliant pin 414 that is not in direct physical contact with a bottom surface 406 of the surface interconnect 405. As discussed above, the surface interconnect 405 may be formed by drilling into one or more layers of the PCB 402. The compliant pin 414 may have a tapered side wall 416. Similarly, the surface interconnect 405 may also have a tapered side wall 408. According to various embodiments, a taper angle of the tapered side wall 416 of the compliant pin 414 may be substantially equal to a taper angle of the tapered side wall 408 of the surface interconnect 405.

The compliant pin 414 may be soldered in place upon being coupled to, i.e. inserted within, the surface interconnect 405. According to various embodiments, the solder 418 may be provided within the surface interconnect 405 to fill the gap between the compliant pin 414 and the surface interconnect 405. The soldered assembly may be reliably used in rugged applications. Even during extreme vibration, the soldered assembly may prevent the electrical interconnect 404 from decoupling from the PCB 402.

Figure 4B:
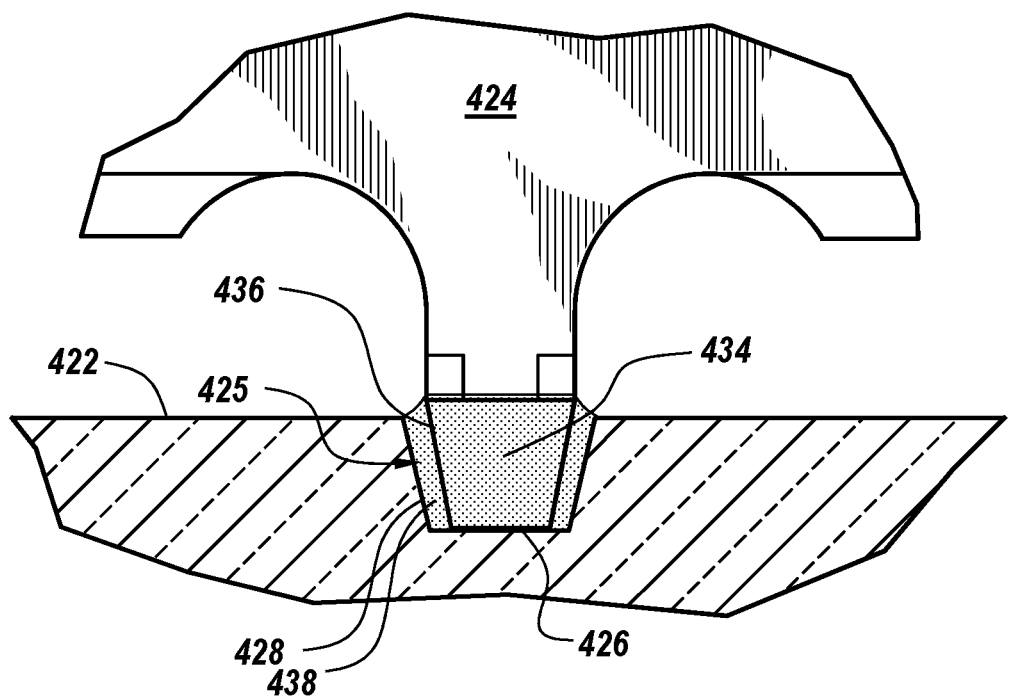
FIG. 4B illustrates an exemplary electrical connector with a long tapered compliant pin coupled to a linearly tapered surface interconnect on a PCB and soldered thereto according to an illustrative embodiment of the present invention.

FIG. 4B illustrates an electrical connector 424 with a compliant pin 434. The compliant pin 434 is sized and dimensioned to be in substantially direct physical and electrical contact with a bottom surface 426 of the surface interconnect 425. As discussed above, the surface interconnect 425 may be formed by drilling into one or more layers of the PCB 422. The compliant pin 434 may have a tapered side wall 436. Similarly, the surface interconnect 425 may also have a tapered side wall 428. According to various embodiments, a taper angle of the tapered side wall 436 of the compliant pin 434 may be substantially equal to a taper angle of the tapered side wall 428 of the surface interconnect 425.

The compliant pin 434 may be soldered in place upon being coupled to, i.e. inserted within, the surface interconnect 425. According to various embodiments, the solder 438 may be provided within the surface interconnect 425 to fill the gap between the compliant pin 434 and the surface interconnect 425.

Figure 4C:
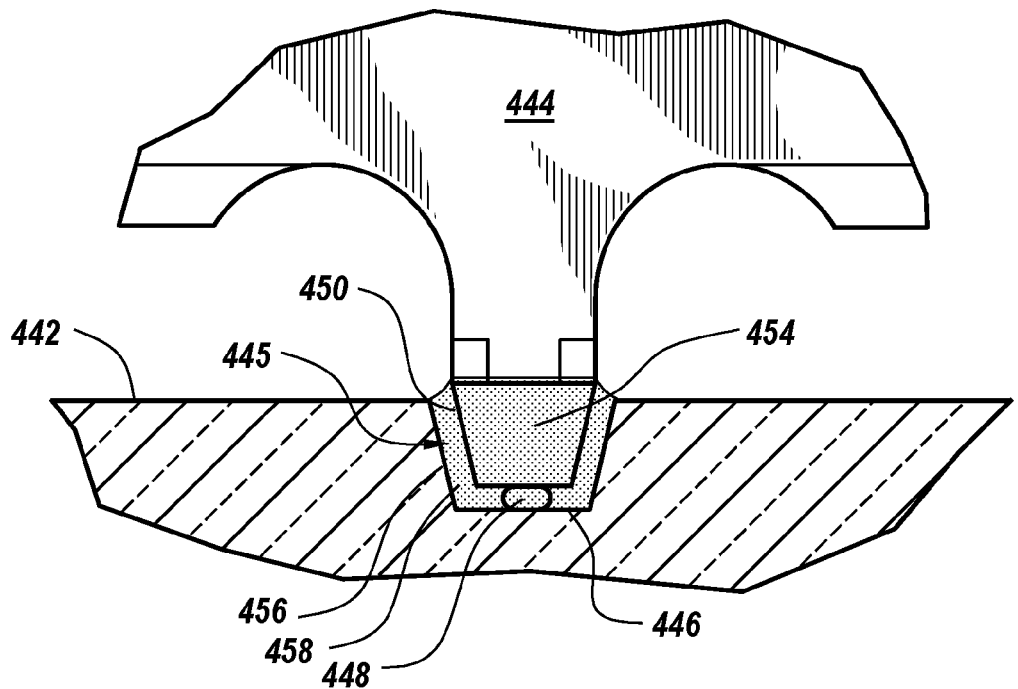
FIG. 4C illustrates an exemplary electrical connector with an anchoring spur attached to a distal end of a tapered compliant pin coupled to a tapered surface interconnect on a PCB and soldered thereto according to an illustrative embodiment of the present invention.

FIG. 4C illustrates an electrical connector 444 with a compliant pin 454. The compliant pin 454 is inserted within a surface interconnect 445. The surface interconnect 445 may be drilled though one or more layers of the PCB 442. An anchoring spur 448 may be coupled to a distal end of the compliant pin 454 such that the anchoring spur 448 is in a substantially direct physical and electrical contact with the distal end of the compliant pin 454 and a bottom surface 446 of the surface interconnect 445. The compliant pin 454 may have a tapered side wall 450. Similarly, the surface interconnect 445 may also have a tapered side wall 456. According to various embodiments, a taper angle of the tapered side wall 450 of the compliant pin 454 may be substantially equal to a taper angle of the tapered side wall 456 of the surface interconnect 445.

The compliant pin 454 may be soldered in place upon being coupled to, i.e. inserted within, the surface interconnect 445. According to various embodiments, the solder 458 may be provided within the surface interconnect 445 to fill the gap between the compliant pin 454 and the surface interconnect 445.

Figure 4D:
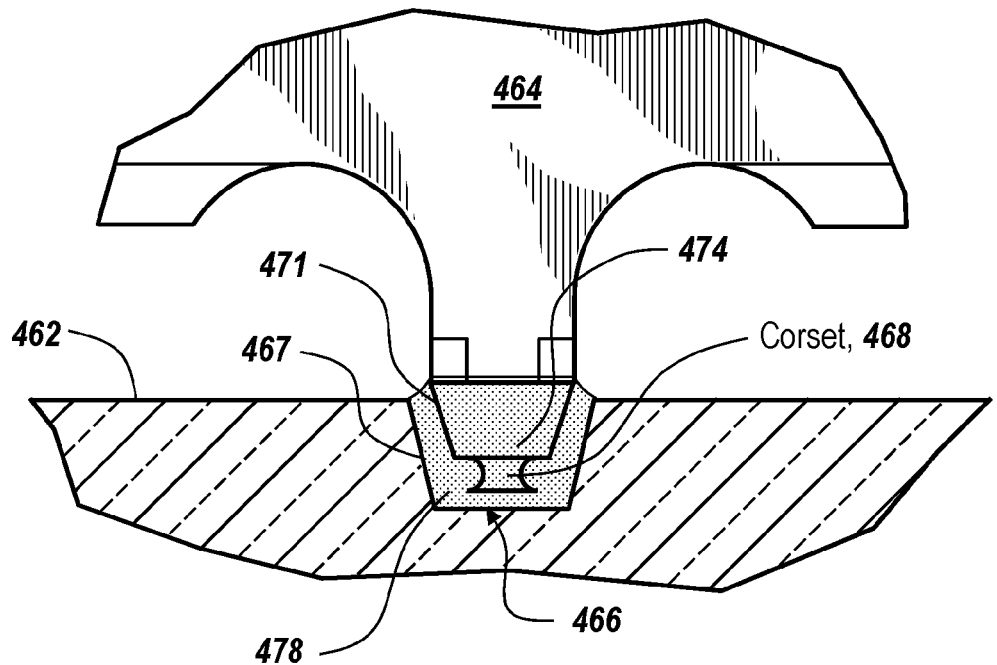
FIG. 4D illustrates an exemplary electrical connector with a corset anchor attached to a distal end of a tapered compliant pin coupled to a tapered surface interconnect on a PCB and soldered thereto according to an illustrative embodiment of the present invention.

FIG. 4D illustrates an electrical connector 464 with a compliant pin 474. The compliant pin 474 is inserted within a surface interconnect 466 formed on a top surface of a PCB 462. The surface interconnect 466 may be formed by drilling into one or more layers of the PCB 462. The compliant pin 474 may have a tapered side wall 471. Similarly, the surface interconnect 466 may also have a tapered side wall 467. According to various embodiments, a taper angle of the tapered side wall 471 of the compliant pin 474 may be substantially equal to a taper angle of the tapered side wall 467 of the surface interconnect 466. According to various embodiments, the compliant pin 474 of the electrical interconnect 464 may be soldered in place inside the surface interconnect 466. The solder 478 may be provided within the surface interconnect 466 to fill the gap between the compliant pin 474 and the surface interconnect 466.

As illustrated in FIG. 4D, a corset anchor 468 may be coupled to a distal end of the compliant pin 474. The corset anchor 468 may further limit the movement of the electrical connector 464 away from the PCB 462 by hooking in the solder 478 within the surface interconnect 466.

Figure 4E:
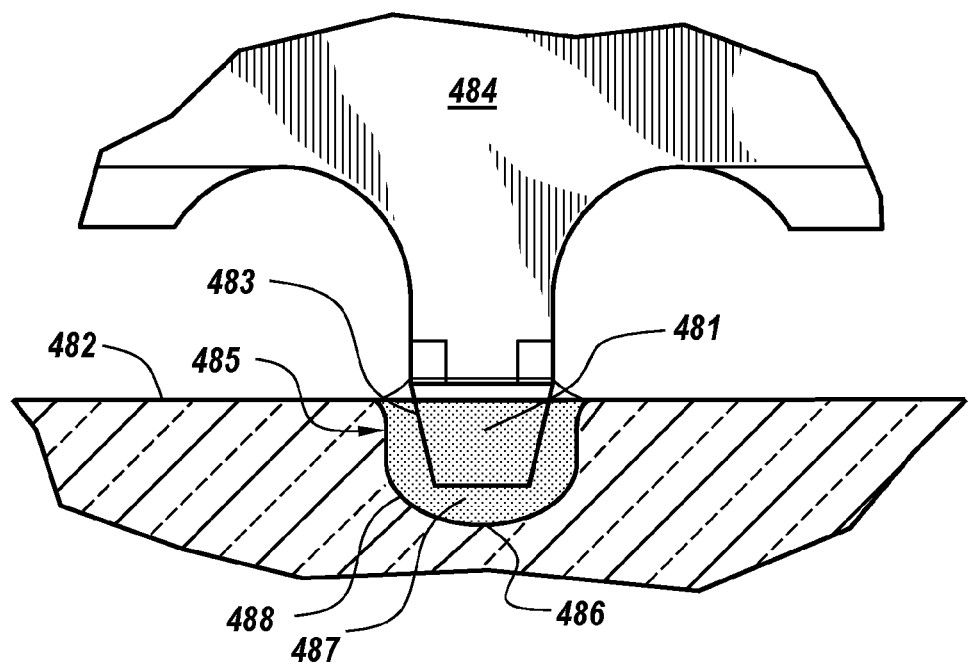
FIG. 4E illustrates an exemplary electrical connector with a short tapered compliant pin coupled to a partially concave tapered surface interconnect on a PCB and soldered thereto according to an illustrative embodiment of the present invention.

FIG. 4E illustrates an electrical connector 484 with a compliant pin 481 that is not in direct physical contact with a bottom surface 486 of the surface interconnect 485. As discussed above, the surface interconnect 485 may be formed by drilling into one or more layers of the PCB 482. The compliant pin 481 may have a tapered side wall 483.

Similarly, the surface interconnect 485 may also have a tapered side wall 488. According to various embodiments, the tapered side wall 483 of the compliant pin 481 may fit inside a side wall 488 of the surface interconnect 485. The side wall 488 of the surface interconnect 485 may have at least one of no inclination, a linear inclination up to 15°, and a concave inclination. The side wall 488 may a flared entrance aperture.

The compliant pin 481 may be soldered in place upon being coupled to, i.e. inserted within, the surface interconnect 485. According to various embodiments, the solder 487 may be provided within the surface interconnect 485 to fill the gap between the compliant pin 481 and the surface interconnect 485. The soldered assembly may be reliably used in rugged applications. Even during extreme vibration, the soldered assembly may prevent the electrical interconnect 484 from decoupling from the PCB 482.

Figure 4F:
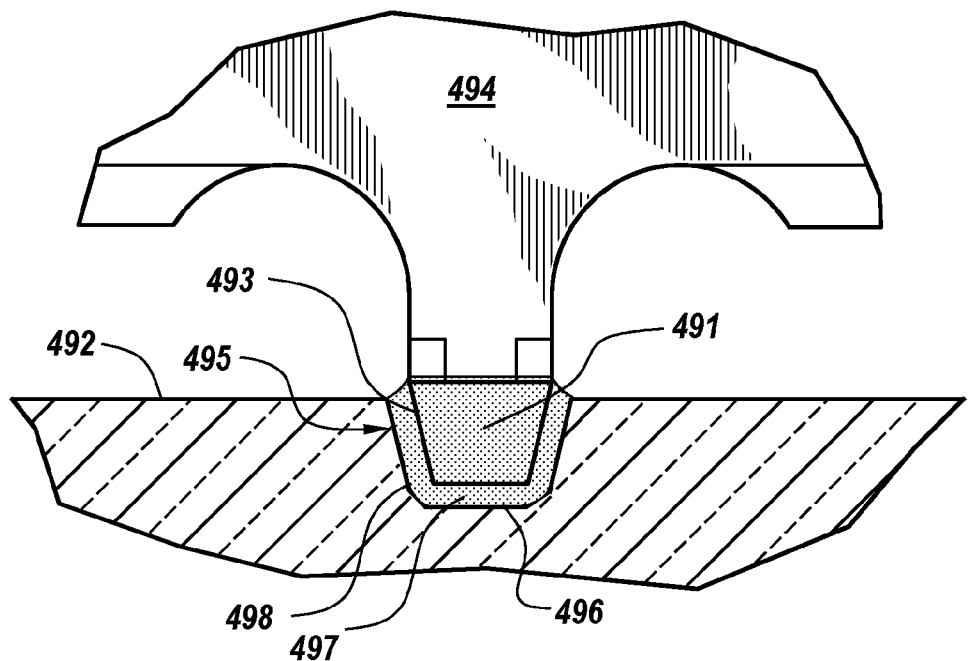
FIG. 4F illustrates an exemplary electrical connector with a short tapered compliant pin coupled to a linearly tapered surface interconnect on a PCB, where the intersection between the bottom surface of the surface interconnect and the tapered side wall of the surface interconnect may be rounded, and soldered thereto according to an illustrative embodiment of the present invention.

FIG. 4F illustrates an electrical connector 494 with a compliant pin 491 that is not in direct physical contact with a bottom surface 496 of the surface interconnect 495. As discussed above, the surface interconnect 495 may be formed by drilling into one or more layers of PCB 492. The compliant pin 491 may have a tapered side wall 493. Similarly, the surface interconnect 495 may also have a tapered side wall 498. According to various embodiments, a taper angle of the tapered side wall 493 of the compliant pin 491 may be substantially equal to a taper angle of the tapered side wall 498 of the surface interconnect 495.

According to various embodiments, an intersection between the bottom surface 496 of the surface interconnect 495 and the tapered side wall 498 of the surface interconnect 495 may be rounded. The bottom surface 496 of the surface interconnect 495 may be flat and/or concave. As a result of the rounded intersection between the bottom surface 496 of the surface interconnect 495 and the tapered side wall 498 of the surface interconnect 495, the compliant pin 491 is less likely to be damaged during the insertion process over conventional surface interconnects on a PCB. In addition, the rounded intersection between the bottom surface 496 of the surface interconnect 495 and the tapered side wall 498 of the surface interconnect 495 may prevent voids in the solder 497 and may allow solder flux to more efficiently evacuate the surface interconnect 495 during the soldering process, as compared to conventional surface interconnects on a PCB.

The compliant pin 491 may be soldered in place upon being coupled to, i.e. inserted within, the surface interconnect 495. According to various embodiments, the solder 497 may be provided within the surface interconnect 495 to fill the gap between the compliant pin 491 and the surface interconnect 495. The soldered assembly may be reliably used in rugged applications. Even during extreme vibration, the soldered assembly may prevent the electrical interconnect 494 from decoupling from the PCB 492.

Figure 5:
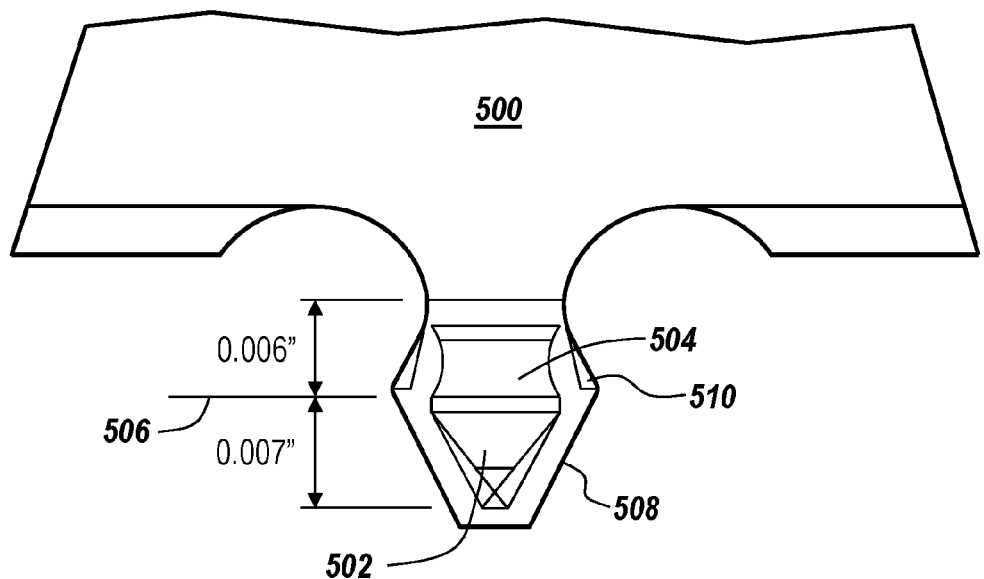
FIG. 5 illustrates dimensions of an exemplary compliant pin according to various embodiments of the present invention.

FIG. 5 illustrates the size and dimension of an exemplary compliant pin 502 of an electrical connector 500. The compliant pin of the electrical connector discussed herein may be sized and dimensioned to fit into a surface interconnect formed by drilling through one or more layers of a PCB. The compliant pin 502 may have a tapered shape created by an inclined side wall provided around the circumference of the compliant pin 502. A divot 504 may be provided above the tapered surface of the compliant pin 502. The divot 504 may be a continuous divot formed around a circumference of the compliant pin 502. Alternatively, the divot 504 may include one or more divots formed above the tapered surface of the compliant pin 502. When the electrical connector 500 is coupled and soldered to a PCB 506, the divot 504 may provide a neck to prevent the electrical connector 500 from decoupling from the PCB 506. If the electrical connector 500 is forced to move away from the PCB 506, the divot 504 may hook in the solder 510 provided around the divot 504. The solder 510 above the top surface of the PCB 506 may form a fillet which strengthens the coupling between the compliant pin 502 and the PCB 506.

According to various embodiments, the divot 504 of the electrical connector 500 may be up to 0.005" high. When the compliant pin 502 and the divot 504 are soldered, the height of the soldered divot 504 may be up to 0.006" high. A height of the compliant pin 502 of the electrical connector 500 provided beneath the top surface of the PCB 506 may be up to 0.007" high. When the compliant pin 502 and the divot 504 are soldered, the height of the soldered compliant pin 502 may be up to 0.008" high. The solder 508 around the compliant pin 502 may have a tapered surface similar to that of the compliant pin 502. For example, the solder 508 around the compliant pin 502 beneath the top surface of the PCB 506 may have a taper angle of up to 27°.

Figure 6:
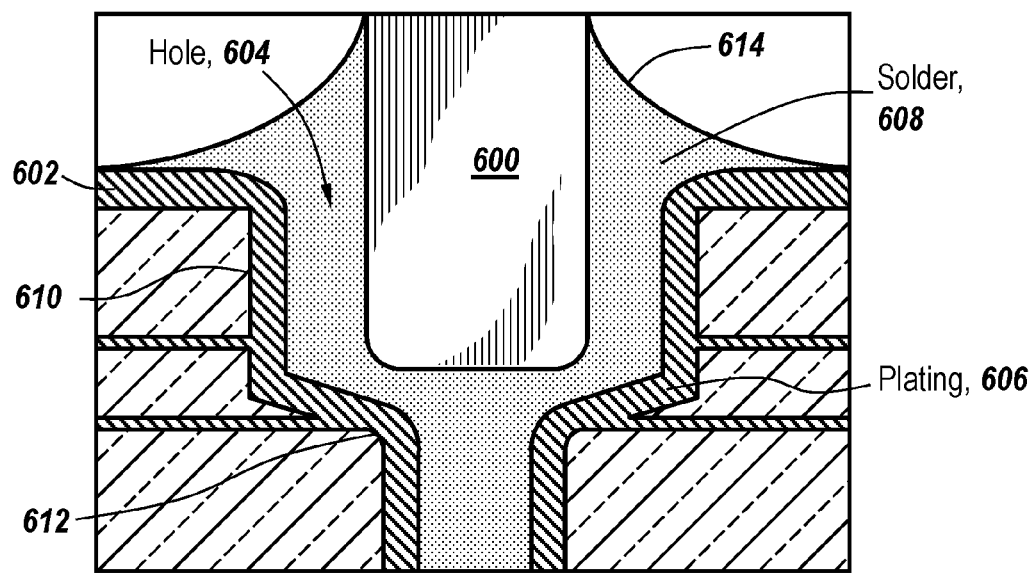
FIG. 6 illustrates a cross sectional view of a compliant pin coupled to a tapered surface interconnect on a PCB and soldered thereto.

FIG. 6 illustrates a cross section of an exemplary compliant pin coupled to a surface interconnect provided on a surface of a PCB. As illustrated in FIG. 6, a surface interconnect hole 604 may be drilled on one or more top layers of the PCB 602. The surface interconnect hole 604 may be plated using a plating material 606. The surface interconnect hole 604 may have a tapered side wall 610 and/or a tapered bottom surface 612. According to various embodiments, the surface interconnect hole 604 may have a diameter of up to 8 millimeters (mm) and a depth of up to 5 millimeters. The taper angle of the side wall 610 of the surface interconnect 602 may have at least one of no inclination, a linear inclination up to 15°, and a concave inclination. The side wall 610 may a flared entrance aperture. A compliant pin 600 may be provided within the surface interconnect hole 604 and soldered therein with solder 608. The solder 608 may be provided around the compliant pin 600 within the surface interconnect hole 604 and around the compliant pin 600 above the top surface of the PCB 602. The solder above the top surface of the PCB 602 may have a solder fillet 614 with a tapered surface. The solder fillet 614 represents a concave surface of the solder at the intersection of electrical connector 600 and top surface of the PCB 602.

Figure 7A:
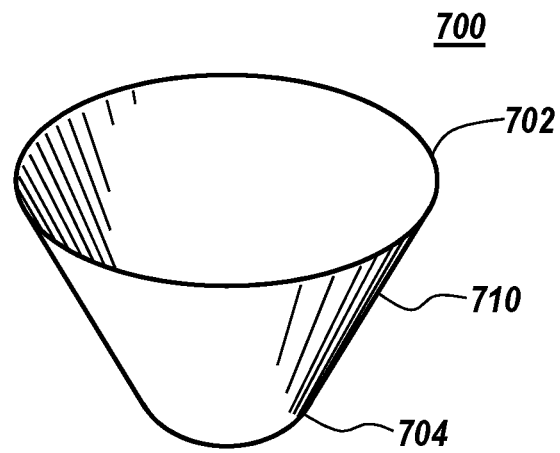
FIGS. 7A-7B illustrate an exemplary tapered surface interconnect shape according to various embodiments of the present invention.
Figure 7B:
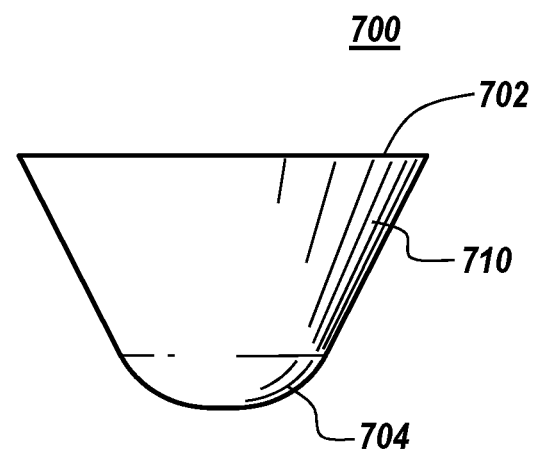

FIGS. 7A-7B illustrates the shape, size and dimensions of an exemplary surface interconnect. According to various embodiments, the surface interconnect 700 drilled on and/or into one or more layers of a PCB may have a top surface 702 radius of up to 8 mm, a depth of up to 5 mm and a bottom surface 704 radius equal to or smaller than the top surface 702 radius depending on the inclination of the side wall 710.

The side wall 710 of the surface interconnect 700 may be tapered to provide a tight fit between the surface interconnect 700 and an electrical connector that may be coupled thereto.

The foregoing description may provide illustration and description of various embodiments of the invention, but is not intended to be exhaustive or to limit the invention to the precise form disclosed. Modifications and variations may be possible in light of the above teachings or may be acquired from practice of the invention.

In addition, one or more implementations consistent with principles of the invention may be implemented using one or more devices and/or configurations other than those illustrated in the Figures and described in the Specification without departing from the spirit of the invention. One or more devices and/or components may be added and/or removed from the implementations of the figures depending on specific deployments and/or applications. Also, one or more disclosed implementations may not be limited to a specific combination of hardware.

No element, act, or instruction used in the description of the invention should be construed critical or essential to the invention unless explicitly described as such. Also, as used herein, the article "a" is intended to include one or more items. Where only one item is intended, the term "a single" or similar language is used.

It is intended that the invention not be limited to the particular embodiments disclosed above, but that the invention will include any and all particular embodiments and equivalents falling within the scope of the following appended claims.

That which is claimed:

1. An electrical compliant pin connector comprising:
a connector body; and
a compliant pin provided at a first end of the connector body, wherein the connection pin includes:
a tapered end having a tapered surface, having dimensions for a substantially complete insertion below a top surface of a printed circuit board and having a height of up to 0.007 inches; and
a groove that is a continuous divot formed directly above the tapered end of the compliant pin around a circumference of the pin to form a neck.

2. The electrical connector of claim 1, wherein the connection pin further includes an anchoring feature at an extremity of the tapered end.

3. The electrical connector of claim 1, wherein a corset anchor is coupled to an extremity of the tapered end.

4. An electrical compliant pin connector, comprising:
a connector body; and
a compliant pin provided at a first end of the connector body, wherein the connector pin includes:
a tapered end having a tapered surface, having dimensions for a substantially complete insertion below a top surface of a printed circuit board and having a height of up to 0.007 inches; and
a groove formed directly above the tapered end of the compliant pin that is a continuous divot around a circumference of the compliant pin to form a neck.

* * * * *